United States Patent
Best et al.

(10) Patent No.: US 7,320,847 B2
(45) Date of Patent: Jan. 22, 2008

(54) ALTERNATE SIDE LITHOGRAPHIC SUBSTRATE IMAGING

(75) Inventors: Keith Frank Best, Prunedale, CA (US); Joseph J. Consolini, Costa Mesa, CA (US); Alexander Friz, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 345 days.

(21) Appl. No.: 10/705,218

(22) Filed: Nov. 12, 2003

(65) Prior Publication Data

US 2004/0142256 A1 Jul. 22, 2004

(30) Foreign Application Priority Data

Nov. 13, 2002 (EP) .................................. 02257846

(51) Int. Cl.
*G03F 9/00* (2006.01)

(52) U.S. Cl. .................... 430/22; 430/313; 430/311

(58) Field of Classification Search ...................... None
See application file for complete search history.

(56) References Cited

U.S. PATENT DOCUMENTS

| 4,737,033 A | 4/1988 | Moldovan et al. |
| 5,286,673 A | 2/1994 | Nishihara |
| 5,436,173 A | 7/1995 | Houston |
| 6,180,498 B1 * | 1/2001 | Geffken et al. ............. 438/462 |
| 6,335,214 B1 | 1/2002 | Fung |
| 2002/0109825 A1 | 8/2002 | Gui et al. |

FOREIGN PATENT DOCUMENTS

| EP | 0 513 684 B1 | 11/1992 |
| JP | 08-153676 A | 6/1996 |
| JP | 2000-232044 A | 8/2000 |
| WO | WO 01/82370 A1 | 11/2001 |

OTHER PUBLICATIONS

European Search Report for EP 03 25 7168 completed Mar. 29, 2004.

* cited by examiner

*Primary Examiner*—John A. McPherson
*Assistant Examiner*—Daborah Chacko-Davis
(74) *Attorney, Agent, or Firm*—Pillsbury Winthrop Shaw Pittman LLP

(57) ABSTRACT

A device manufacturing method capable of imaging structures on one side of a substrate aligned to markers on the other side, is presented herein. One embodiment of the present invention comprises providing a first substrate having first and second surfaces, patterning the first surface of the substrate with at least one reversed alignment marker, providing a protective layer over the alignment marker, and bonding the first surface of the first substrate to a second substrate. The embodiment further includes locally etching the first substrate as far as the protective layer to form a trench around the reversed alignment marker, and forming at least one patterned layer on the second surface using a lithographic projection apparatus having a front-to-backside alignment system while aligning the substrate to the alignment markers revealed in each trench.

26 Claims, 3 Drawing Sheets

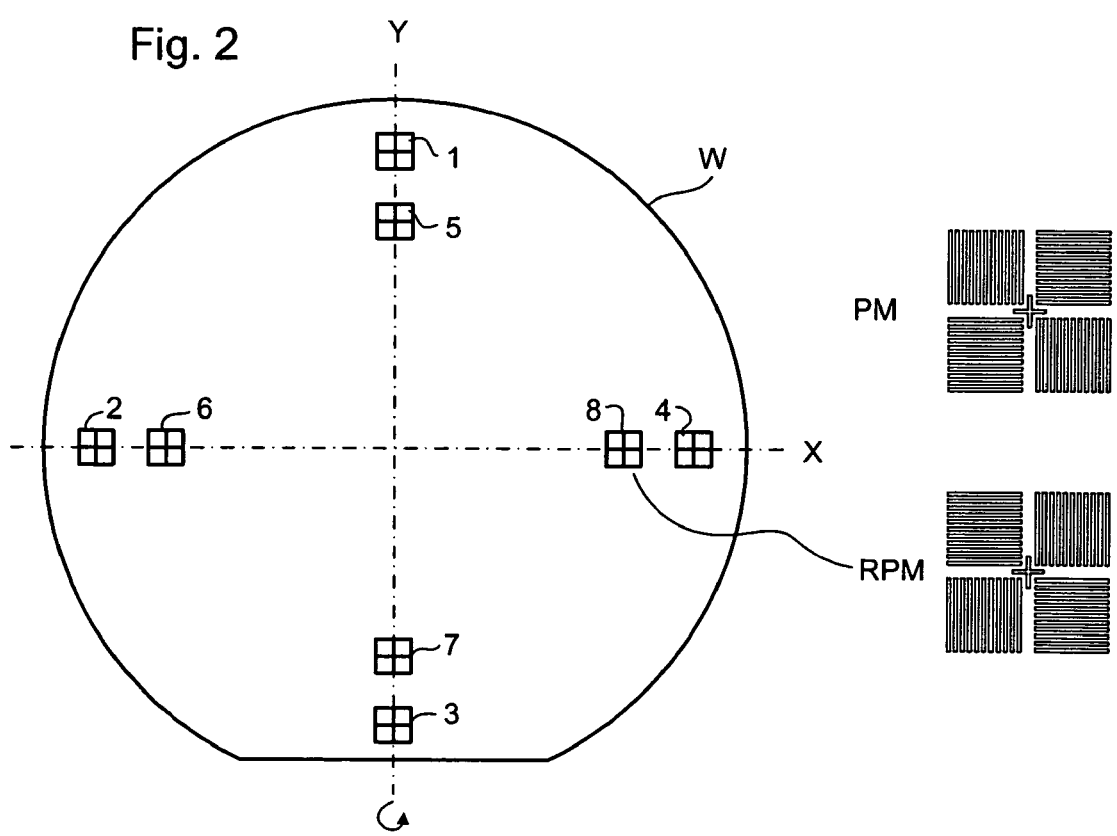

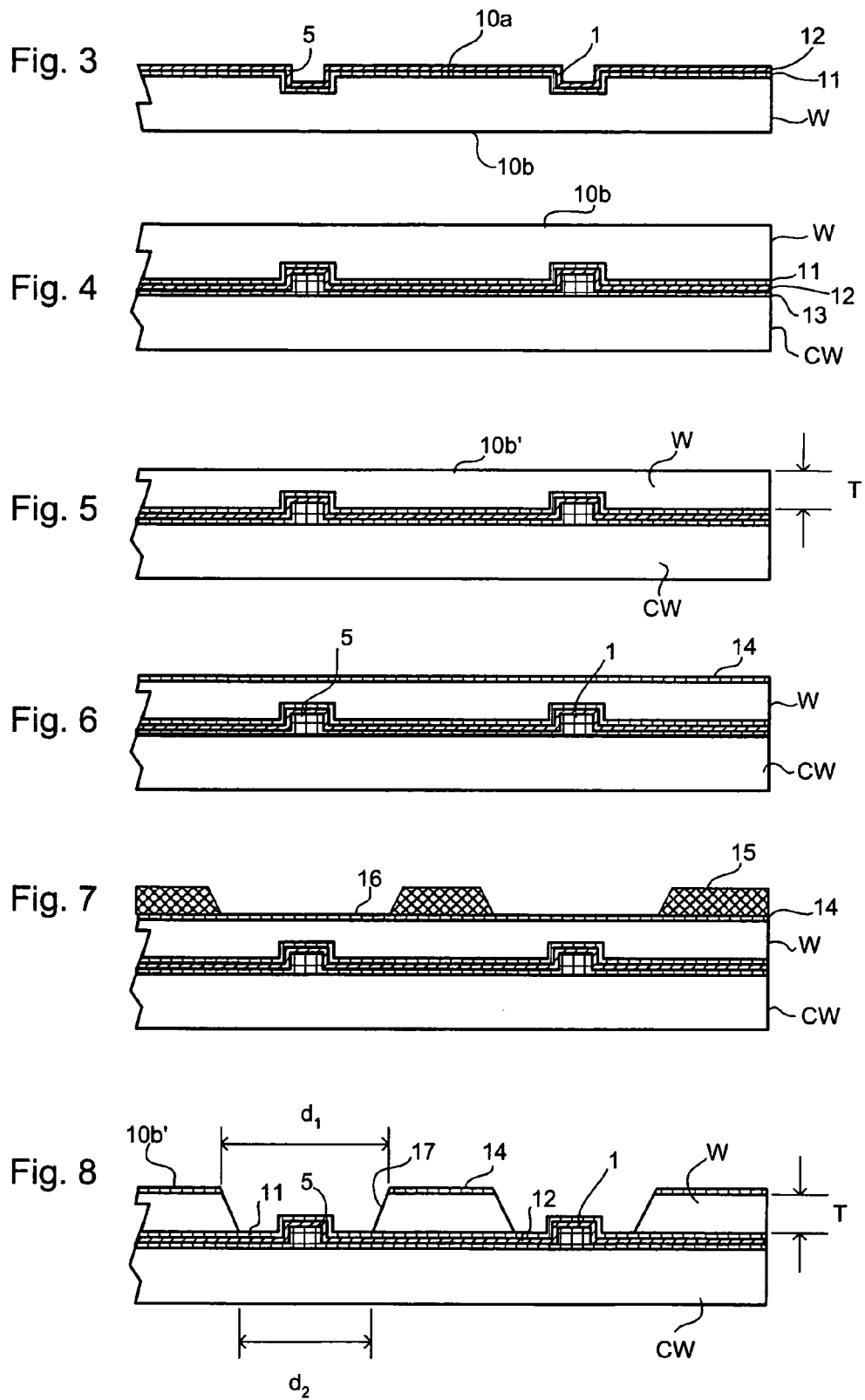

ALTERNATE SIDE LITHOGRAPHIC SUBSTRATE IMAGING

BACKGROUND OF THE INVENTION

This application claims priority from European Patent Application No. EP 02257846.2, filed Nov. 13, 2002, herein incorporated by reference in its entirety.

1. Field of the Invention

The present invention relates to lithographic projection apparatus and more particularly to a lithographic device manufacturing method.

2. Description of the Related Art

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as employed herein should be broadly interpreted as referring to a mechanism that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

- mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;
- programmable mirror array: an example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and
- programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth above.

In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus—commonly referred to as a wafer stepper—each target portion is irradiated by exposing the entire mask pattern onto the target portion in one go. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Because, typically, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, the pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In a lithography apparatus, it is important to align the mask with the substrate wafer. In other words, alignment is the process of positioning the image of a specific point on the mask to a specific point on the wafer which is to be exposed. Typically one or more alignment marks, such as a small pattern, are provided on each of the substrate and the mask. A device may consist of many layers which are built up by successive exposures with intermediate processing steps. Before each exposure, alignment between the markers on the substrate and the mask is performed to minimize any positional error between the new exposure and the previous ones, which error is termed overlay error.

For some devices, e.g. micro-electro-mechanical systems (MEMS) and micro-opto-electro-mechanical systems (MOEMS), it is desirable to be able to create structures on both sides of a substrate using lithographic processes and, in many cases, the structures on opposite sides of the substrate need to be aligned with each other. This means that it is necessary for the lithographic apparatus to align the pattern being projected onto the front side of a substrate to alignment markers on the backside.

To achieve this alternate side imaging, various efforts have employed additional hardware, e.g. optics to project an image of a backside marker to the front side of the substrate or using a special substrate that is transparent. Infra-red radiation can be used with a silicon substrate but has limited accuracy and may undesirably heat the wafer.

SUMMARY OF THE INVENTION

Principles of the present invention, as embodied and broadly described herein, provide for a device manufacturing method which can image structures on one side of a substrate aligned to markers on the other side without the need for additional hardware and with improved accuracy. One embodiment of the present invention comprises providing a first substrate having first and second surfaces, patterning the first surface of the substrate with at least one reversed alignment marker, providing a protective layer over the alignment marker, and bonding the first surface of the first substrate to a second substrate. The embodiment further includes locally etching the first substrate as far as the protective layer to form a trench around the reversed alignment marker, and forming at least one patterned layer on the second surface using a lithographic projection apparatus having a front-to-backside alignment system while aligning the substrate to the alignment markers revealed in each trench.

The reversed alignment marker formed in the first surface is revealed by the etch as a normally oriented alignment marker to which the lithographic projection apparatus can readily align. Patterns directly aligned to the marker printed on the front side can therefore be printed on the backside of the substrate.

The protective layer which conforms to the shape of the marker is preferably formed of a material, e.g. $SiO_2$, selective against the etch used to form the trench(es) and hence forms an etch stop layer. A reflective layer, e.g. of Al, can be formed over the protective layer (before bonding) to increase the visibility of the marker when revealed in the trench.

The etch step can be localized by forming an etch-resistant layer, e.g. of oxide, on the second surface; providing a layer of radiation-sensitive resist on the etch-resistant layer; patterning and developing said resist so as to form openings above said marker(s); and removing said etch-resistant layer in said openings. To pattern the resist to form the openings, the markers only need to be located coarsely, which can be done to sufficient degree of accuracy using an infra-red mark sensor from the second side of the substrate.

Before the substrate is bonded to the second (carrier) substrate, devices may be formed in and/or on the first surface using known techniques. The protective layer and optional reflective layer may be formed as part of device layers, with any intervening layers locally removed as necessary, rather than being specially formed.

Normal alignment markers for use in aligning the structures in or on the first surface can be printed in the same step as the reverse alignment markers used to align the structures formed on the second surface. In this way, the positional relationship of the normal and reversed markers and hence of the structures on the first and second surfaces can be assured.

After bonding, the first substrate may be reduced in thickness, e.g. by grinding.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which:

FIG. 2 is a plan view of a substrate showing the location of alignment markers used in one embodiment of the invention; and FIGS. 3 to 8 illustrate steps in accordance with an embodiment of the invention.

In the Figures, corresponding reference symbols indicate corresponding parts.

DETAILED DESCRIPTION

Lithographic Projection Apparatus

Figure 1:
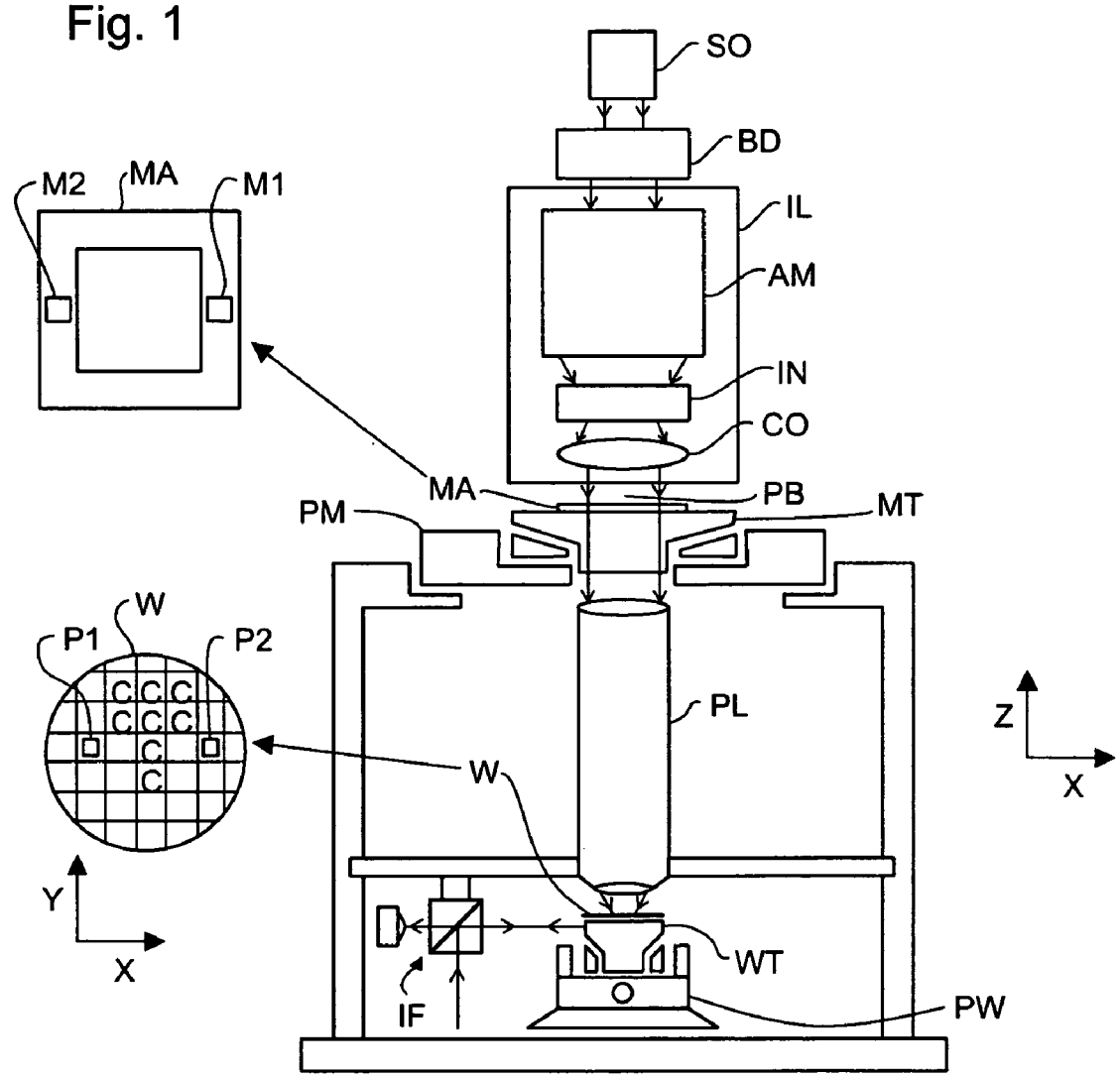
FIG. 1 depicts a lithographic projection apparatus depicts, which can be used in one embodiment of the invention.

FIG. 1 schematically depicts a lithographic projection apparatus according to a particular embodiment of the invention. The apparatus comprises:

- a radiation system Ex, IL: for supplying a projection beam PB of radiation (e.g. UV radiation such as for example generated by an excimer laser operating at a wavelength of 248 nm, 193 nm or 157 nm, or by a laser-fired plasma source operating at 13.6 nm). In this particular case, the radiation system also comprises a radiation source LA;
- a first object table (mask table) MT: provided with a mask holder for holding a mask MA (e.g. a reticle), and connected to first positioning mechanism PM for accurately positioning the mask with respect to item PL;
- a second object table (substrate table) WT: provided with a substrate holder for holding a substrate W (e.g. a resist-coated silicon wafer), and connected to second positioning mechanism PW for accurately positioning the substrate with respect to item PL; and
- a projection system ("lens") PL: (e.g. a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning mechanism, such as a programmable mirror array of a type as referred to above.

The source LA (e.g. a UV excimer laser, a laser-fired plasma source, a discharge source, or an undulator or wiggler provided around the path of an electron beam in a storage ring or synchrotron) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism PW (and interferometric measuring mechanism IF), the substrate table WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan.

In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

- step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and
- scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Embodiment 1

FIG. 2 shows a wafer W which is to be provided with devices on both sides and on which are provided normal markers (not shown) and reversed markers 1-8. The reversed markers 1-8 are mirror images—about the axis about which the wafer is to be rotated, in this case the Y axis—of the normal markers. The normal markers may take any convenient form, such as a grating, a group of gratings, box-in-box, frame-in-frame, chevrons, etc., as known in the art, and may form the primary markers used for global alignment of the substrate prior to a series of exposures.

In FIG. 2, examples of a reverse primary marker and, for reference, a normal primary marker, each formed by four gratings, are shown. Of the four gratings, a pair are horizontal and a pair vertical and, though not apparent from the drawing, the two gratings of each pair have different periods in a known manner. In the present example the markers are provided at symmetrical positions on the wafer axes. The present invention may of course also be applied to other markers, e.g. markers adjacent each target area or die.

FIGS. 3 to 8 illustrate steps in an example of the method of the invention. Firstly, normal markers (not shown) and reversed markers 1-8 are etched into first surface 10a of wafer W in a known manner and covered by a protective layer 11 of $SiO_2$ and a reflective layer 12 of Al, as shown in FIG. 3, which is a partial cross-section along the Y axis of FIG. 2. The substrate W is then flipped over and bonded to carrier substrate CW with a layer of adhesive 13. FIG. 4 shows the substrate W bonded to the carrier substrate CW, with the second surface 10b uppermost.

As shown in FIG. 5, the wafer W is ground to a desired thickness, T, e.g. of about 70 μm, and the upper surface 10b' finished as required for the devices to be formed on it.

To locally etch through the first substrate to reveal the reversed markers 1-8, the second surface 10b' is first covered with a layer of oxide 14, e.g. by deposition, as shown in FIG. 6 and a layer of resist 15 which is exposed to open primary flood windows 16 above the reversed markers 1-8. Since the primary flood windows 16 are rather larger than the markers they do not have to be accurately located and the exposure step to form them can be carried out after the markers have been located using a coarse alignment tool, such as a mark sensor using infra-red, that can detect the reversed markers through the substrate W.

The oxide layer 14 is removed in the windows 16 by a dry etch RIE or wet etch (Buffered Oxide Etch Containing HF) step to form a hardmask and a deep trench etch using an etchant selective to Si is performed to form trenches 17. The deep trench etch ends on the $SiO_2$ layer and so the trenches 17 extend down to the reversed primary markers 1, 5 to reach the position shown in FIG. 8. Thereafter, device layers can be formed on the second surface 10b' with alignment to the reversed markers 1-8 revealed in trenches 17. The trenches have a width $d_1$ at their tops that is sufficient, e.g. 1200 μm, to ensure that the width $d_2$ at their base is large enough, e.g. 1000 μm, to accommodate comfortably the markers 1-8. The oxide layer 14 is then removed prior to continued processing.

The first step in continued processing of the bonded substrate may be to print further markers, at known positions relative to the revealed markers, on the second surface 10b', now uppermost, of the wafer. The further markers can be aligned to in the further processing of the second surface more conveniently than the revealed markers.

Whilst specific embodiments of the invention have been described above, it will be appreciated that the invention may be practiced otherwise than as described. The embodiments described above may, instead, be implemented in different embodiments of software, firmware, and hardware in the entities illustrated in the figures.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A device manufacturing method comprising:
    providing a first substrate having a first and second surface on a first and second side thereof, respectively;
    patterning said first surface of said first substrate with normal alignment markers and at least one reversed alignment marker that is a mirror image of at least one of the normal alignment markers;
    providing a protective layer over said at least one reversed alignment marker;
    bonding said first substrate to a second substrate with said first side of said first substrate facing said second substrate;
    locally etching said first substrate as far as said protective layer to form a trench substantially devoided of material around said at least one reversed alignment marker; and
    forming at least one patterned layer on said second surface of said first substrate using a lithographic projection apparatus having an alignment system configured to align said second surface using the at least one reversed alignment marker(s) revealed by each trench.

2. The method of claim 1, wherein said protective layer comprises a material selective against the etch used to form each trench in order to form an etch stop layer.

3. The method of claim 2, wherein said protective layer material comprises $SiO_2$.

4. The method of claim 1, further comprising, prior to said bonding, forming a reflective layer over said protective layer to increase visibility of said at least one reversed alignment marker when revealed by said trench.

5. The method of claim 4, wherein said reflective layer comprises Al.

6. The method of claim 4, further comprising, prior to said bonding, fanning devices on said first surface.

7. The method of claim 4, wherein protective layer, or said reflective layer, or both said protective layer and said reflective layer, is formed as part of device layers having intervening layers locally removed.

8. The method claim 7, wherein normal alignment markers for use in aligning structures in or on said first surface are printed in the same method as said at least one reversed alignment marker.

9. The method of claim 8, wherein said normal alignment markers are patterned using a same apparatus as is used for patterning process layers.

10. The method of claim 1, wherein said locally etching further comprises,
    forming an etch-resistant layer on said second surface,
    providing a layer of radiation-sensitive resist on said etch-resistant layer,
    patterning and developing said radiation-sensitive resist so as to form openings above said at least one reversed alignment marker, and
    removing said etch-resistant layer in said openings.

11. The method of claim 1, further comprising, after said bonding, reducing thickness of said first substrate.

12. The method of claim 1, wherein said forming at least one patterned layer on said second surface includes forming at least one additional alignment marker at a known position relative to the at least one reversed alignment marker(s) revealed by said trench.

13. The method of claim 1, wherein said alignment system includes a front-to-backside alignment system.

14. A device manufacturing method comprising:
   providing a first substrate having a first surface on a first side and a second surface on a second side;
   patterning said first surface of said first substrate with at least one first marker and at least one second marker, said second marker having reverse attributes of said first marker;
   providing a protective layer over said at least one second marker;
   bonding said first substrate to a second substrate with said first side of said first substrate facing said second substrate;
   locally etching said first substrate as far as said protective layer to reveal said at least one second marker by forming a trench substantially devoided of material around said at least one second marker; and
   forming at least one patterned layer on said second surface of said first substrate by aligning said first substrate to said at least one second marker revealed by each trench.

15. The method of claim 14, wherein said protective layer comprises a material selective against the etch used to form each trench in order to form an etch stop layer.

16. The method of claim 15, further comprising, prior to said bonding, forming a reflective layer over said protective layer to increase visibility of said at least one second marker when revealed by said trench.

17. The method of claim 16, further comprising, prior to said bonding, forming devices on said first surface.

18. The method of claim 17, wherein said protective layer, or said reflective layer, or both said protective layer and said reflective layer, is formed as part of device layers having intervening layers locally removed.

19. The method of claim 15, wherein said protective layer material comprises $SiO_2$.

20. The method of claim 16, wherein said reflective layer comprises Al.

21. The method of claim 14, wherein said at least one first marker are produced in the same method as said at least one second marker.

22. The method of claim 14, wherein said locally etching further comprises,
   forming an etch-resistant layer on said second surface,
   providing a layer of radiation-sensitive resist on said etch-resistant layer,
   patterning and developing said radiation-sensitive resist so as to form openings above said at least one second marker, and
   removing said etch-resistant layer in said openings.

23. The method of claim 14, wherein said forming at least one patterned layer on said second surface includes forming at least one additional of a first and second marker at a known position relative to said at least one second marker revealed by said trench.

24. The method of claim 14, further comprising, after said bonding, reducing thickness of said first substrate.

25. The method of claim 14, wherein said at least one first marker are patterned using a seine apparatus as is used for patterning process layers.

26. The method of claim 14, wherein said aligning is performed using a front-to-backside alignment system.

* * * * *